United States Patent
Lee et al.

(10) Patent No.: US 10,483,457 B1
(45) Date of Patent: Nov. 19, 2019

(54) DIFFERENTIAL SPIN ORBIT TORQUE MAGNETIC RANDOM ACCESS MEMORY (SOT-MRAM) CELL STRUCTURE AND ARRAY

(71) Applicant: QUALCOMM Incorporated, San Diego, CA (US)

(72) Inventors: Hochul Lee, Los Angeles, CA (US); Chando Park, Palo Alto, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/102,941

(22) Filed: Aug. 14, 2018

(51) Int. Cl.
| | |
|---|---|
| *H01L 43/04* | (2006.01) |
| *H01L 27/22* | (2006.01) |
| *H01L 43/06* | (2006.01) |
| *G11C 11/56* | (2006.01) |
| *G11C 11/18* | (2006.01) |
| *G11C 11/16* | (2006.01) |

(52) U.S. Cl.
CPC ............ *H01L 43/04* (2013.01); *G11C 11/161* (2013.01); *G11C 11/1673* (2013.01); *G11C 11/1675* (2013.01); *G11C 11/18* (2013.01); *G11C 11/5607* (2013.01); *H01L 27/228* (2013.01); *H01L 43/065* (2013.01)

(58) Field of Classification Search
None
See application file for complete search history.

(56) References Cited

U.S. PATENT DOCUMENTS

| | | | | |
|---|---|---|---|---|
| 2004/0160809 | A1* | 8/2004 | Lin | G11C 11/16 365/158 |
| 2008/0084724 | A1* | 4/2008 | Nozieres | G11C 15/02 365/50 |
| 2010/0072530 | A1* | 3/2010 | Takizawa | H01L 27/228 257/295 |
| 2016/0049185 | A1* | 2/2016 | Lu | G11C 11/1659 365/158 |
| 2019/0058007 | A1* | 2/2019 | Tsai | G11C 11/1659 |

* cited by examiner

*Primary Examiner* — Douglas King
(74) *Attorney, Agent, or Firm* — Patterson & Sheridan, L.L.P.

(57) ABSTRACT

Aspects of the disclosure provide magnetoresistive random access memory (MRAM) and methods. The MRAM generally includes a first magnetic tunnel junction (MTJ) storage element comprising a first fixed layer, a first insulating layer, and a first free layer, and a second MTJ storage element comprising a second fixed layer, a second insulating layer, and a second free layer. The MRAM further includes a conductive layer connected to a source line, first bit line, and a second bit line, wherein the first MTJ storage element is disposed above and connected to the conductive layer and the first bit line at a first end and connected to the first bit line at a second end, and wherein the second MTJ storage element is disposed above and connected to the conductive layer and the second bit line at a first end and connected to the second bit line at a second end.

8 Claims, 9 Drawing Sheets

DIFFERENTIAL SPIN ORBIT TORQUE MAGNETIC RANDOM ACCESS MEMORY (SOT-MRAM) CELL STRUCTURE AND ARRAY

INTRODUCTION

Field of the Disclosure

Aspects of the present disclosure relate to random access memory (RAM), and more particularly, to techniques for a differential Spin Orbit Torque Magnetic Random Access Memory (SOT-MRAM) cell structure and array.

Description of Related Art

Random access memory (RAM) is a ubiquitous component of modern digital architectures. RAM is commonly integrated or embedded within a device and is used, for example, by microprocessors, microcontrollers, application specific integrated circuits (ASICs), system-on-chip (SoC), and other devices as a storage medium. RAM can be volatile or non-volatile. Volatile RAM begins to lose its charge (i.e., stored information) whenever power is removed. Non-volatile RAM is capable of maintaining information even when power is removed from the memory. Although non-volatile RAM can retain information in the absence of power, certain non-volatile RAM is characterized by slower read and write times than volatile RAM.

Magnetoresistive Random Access Memory (MRAM) is a non-volatile memory technology capable of read and write times comparable to volatile memory. In contrast to conventional RAM technologies, which store data as electric charges or current flows, MRAM uses magnetic materials in a structure called a magnetic tunnel junction (MTJ) storage element. An MTJ is formed from two magnetic layers, each of which can hold a magnetic field and are separated from each other by an insulating layer (or tunnel barrier). One of the two layers is referred to as a fixed layer, and its magnetic polarity is set in a certain direction (i.e., fixed). The fixed layer is designed to maintain its set polarity. The other layer, which is referred to as a free layer, can be set with more than one polarity as described below.

It will be appreciated that changing the polarity of the free layer in an MTJ will change the resistance across the MTJ storage element (i.e., across the fixed layer, insulating layer and free layer). For example, when the polarity of the free layer is set to the same direction as the fixed layer, a low resistance state exists. Conversely, when the polarity of the free layer is set to the opposite direction as the fixed layer, a high resistance state exists. Thus, by changing the orientation of the free layer, the MTJ can take on a low resistance state and a high resistance state. Those skilled in the art will appreciate that the fixed layer, the insulating layer, and the free layer may each comprise one or more layers of materials, compounds, oxides, etc. as is known in the art without deviating from the scope of the disclosure.

MRAM has several desirable characteristics that make it a good candidate for RAM, such as high speed, high density (i.e., small bit cell size), low power consumption, and substantially no degradation over time. However, MRAM suffers from scalability issues. Specifically, as the bit cells become smaller, current density and power consumption needs may increase, thus limiting the useful size of MRAM.

Unlike conventional MRAM, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During the write operation, the spin-polarized electrons exert a torque on the free layer, which can switch the polarity of the free layer. Thus by controlling the flow of spin-polarized electrons, the MTJ in STT-MRAM can be switched from a low resistance to a high resistance and back. The read operation of an MTJ is similar to conventional MRAM in that a current is used to detect the resistance/logic state of the MTJ storage element.

STT-MRAM is characterized by having a shared read and write path. It will be appreciated that the amount of current needed to write (i.e., change the polarity of free layer) is relatively high, which is capable of degrading or destroying the insulating layer and thus the MRAM. One way to combat this problem is to reduce the current needed to write the free layer; however, as current is reduced more time is needed to write the free layer. Thus, other issues may arise, such as an increase in read errors (e.g., where the free layer is written at the time of a data read).

To address some of the limitations with STT-MRAM, Spin Orbit Torque MRAM (or SOT-MRAM) designs have emerged. SOT-MRAM, has a separate write path (e.g., current passing through a spin hall metal near an MTJ) compared to STT-MRAM (e.g., current passing through the MTJ). This structure typically provides less damage to the insulating layer as large currents are not passed through the insulating layer. In SOT-MRAM, the polarity of the free layer in the MTJ element is controlled (i.e., switched) by a spin orbit torque (SOT) (or Spin Hall Effect (SHE)) generated by a current passing through a nearby conductor (e.g., a spin hall metal) which generates electrons that are spin-polarized in a first direction when traveling from end A to end B, and are spin-polarized in the opposite direction when current passing through the nearby conductor passed from end B to end A. The spin-polarized electrons change the free layer between a first state (e.g., high resistance) and second state (e.g., low resistance).

However, as the demand for more capacity, smaller packaging, lower power requirements, and faster switching times continues to increase, there exists a need for further improvements techniques for a differential SOT-MRAM cell structure and array.

BRIEF SUMMARY

The systems and methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved techniques for a differential SOT-MRAM cell structure and array.

In certain aspects, the disclosure provide magnetoresistive random access memory (MRAM) and methods. The MRAM generally includes a first magnetic tunnel junction (MTJ) storage element comprising a first fixed layer, a first insulating layer, and a first free layer, and a second MTJ storage element comprising a second fixed layer, a second insulating layer, and a second free layer. The MRAM further includes a conductive layer connected to a source line, first bit line, and a second bit line, wherein the first MTJ storage element is disposed above and connected to the conductive layer and the first bit line at a first end and connected to the first bit line at a second end, and wherein the second MTJ storage element is disposed above and connected to the conductive layer and the second bit line at a first end and connected to the second bit line at a second end.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

The appended figures depict certain aspects of the one or more embodiments and are therefore not to be considered limiting of the scope of this disclosure.

To facilitate understanding, identical reference numerals have been used, where possible, to designate identical elements that are common to the drawings. It is contemplated that elements and features of one embodiment may be beneficially incorporated in other embodiments without further recitation.

DETAILED DESCRIPTION

Aspects of the present disclosure provide an MRAM cell structure and array and methods and systems for using the same. More specifically, an SOT-MRAM cell with a certain geometry of spin hall metal (SHM) is disclosed for writing at least two complementary bits of a differential SOT-MRAM cell.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

Challenges with current differential SOT-MRAM cell structures include having a large stack height, which uses a large number of layers (or masks) for fabrication. This is a result of current design limitations for differential SOT-MRAM cells because the current differential SOT-MRAM cell structures place a single (i.e., shared) spin Hall metal between two vertically stacked MTJs. The present disclosure provides a differential SOT-MRAM cell structure and array which can reduce stack height and allow for a reduced number of masks for fabrication. Reducing the number of masks can allow for a more cost effective and efficient method of production.

Figure 1:
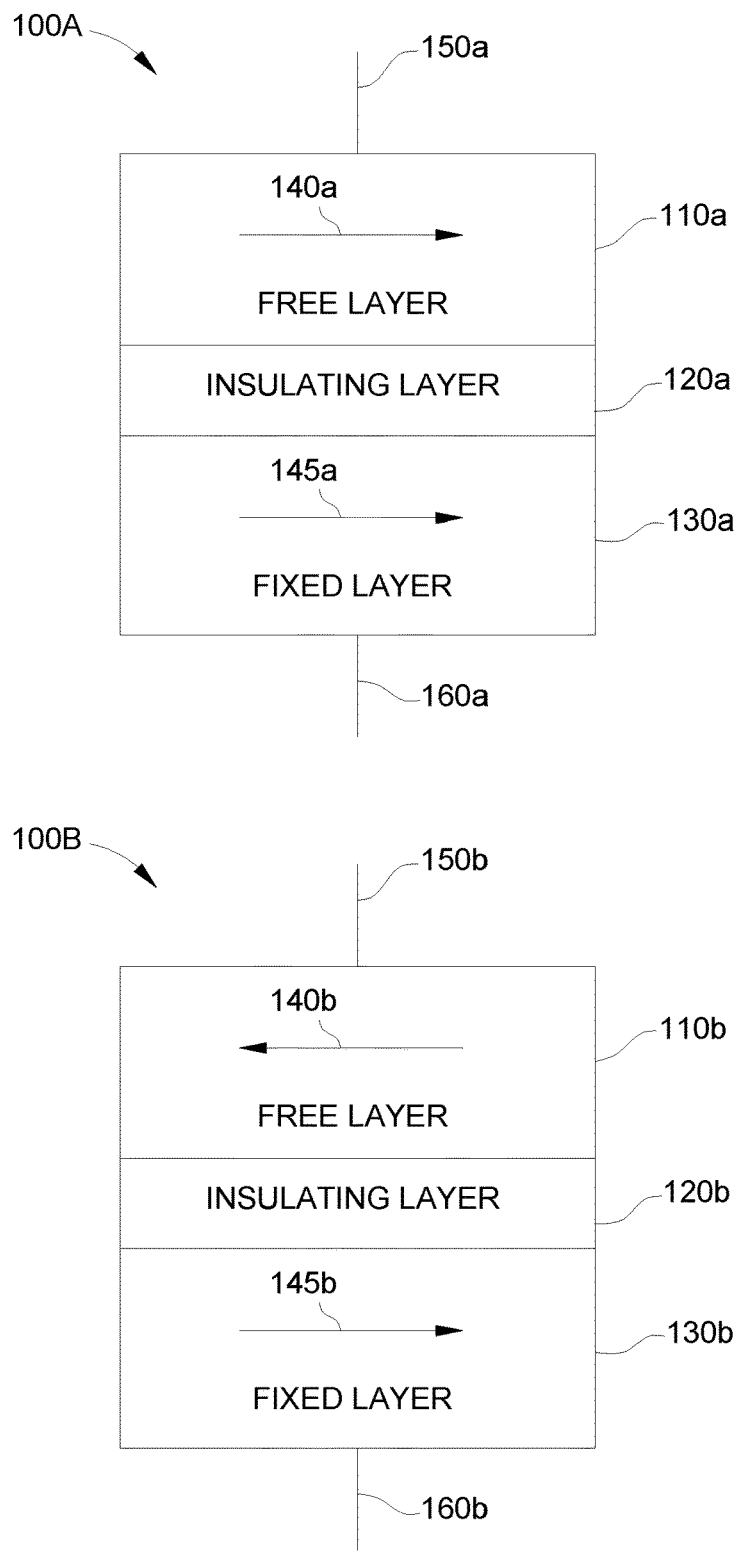
FIG. 1 depicts portions of an STT-MRAM in accordance with certain aspects of the disclosure.

As explained above, MRAM uses the properties of magnetoresistance as a way to store two states of an MTJ (e.g., as a 1 (e.g., high resistance) or a 0 (e.g., low resistance)). FIG. 1 shows an MTJ structure in two operating states, state 100A (a parallel state) and 100B (an anti-parallel state). MTJ 100A includes a free layer 110a, an insulating layer 120a, and a fixed layer 130a. MTJ 100A further includes a switchable polarity 140a of free layer 110a that is shown oriented parallel to the polarity 145a of fixed layer 130a. It will be appreciated that because the polarity of 140a and 145a are parallel, a resistance measured across terminals 150a and 160a is lower than the resistance across terminals 150b and 160b in MTJ 100B, as 100B is shown in an anti-parallel (i.e., high resistance) state. Thus it will be appreciated that the relative polarity (e.g., parallel or anti-parallel) between the free layer 130 and the fixed layer 110 provides two different electrical resistances which can be used to represent a bit being in the off (0) state such as shown in MTJ 100A or in the on (1) state such as shown in MTJ 100B. FIG. 1 shows an in-plane MTJ, which is characterized by polarity 140 and polarity 145 being in a parallel orientation. It will be appreciated that an MTJ may also be a perpendicular MTJ characterized by polarity 140 and polarity 145 being orientated perpendicular to each other (i.e., pointing towards the insulating layer or away from the insulating layer).

Figure 2:
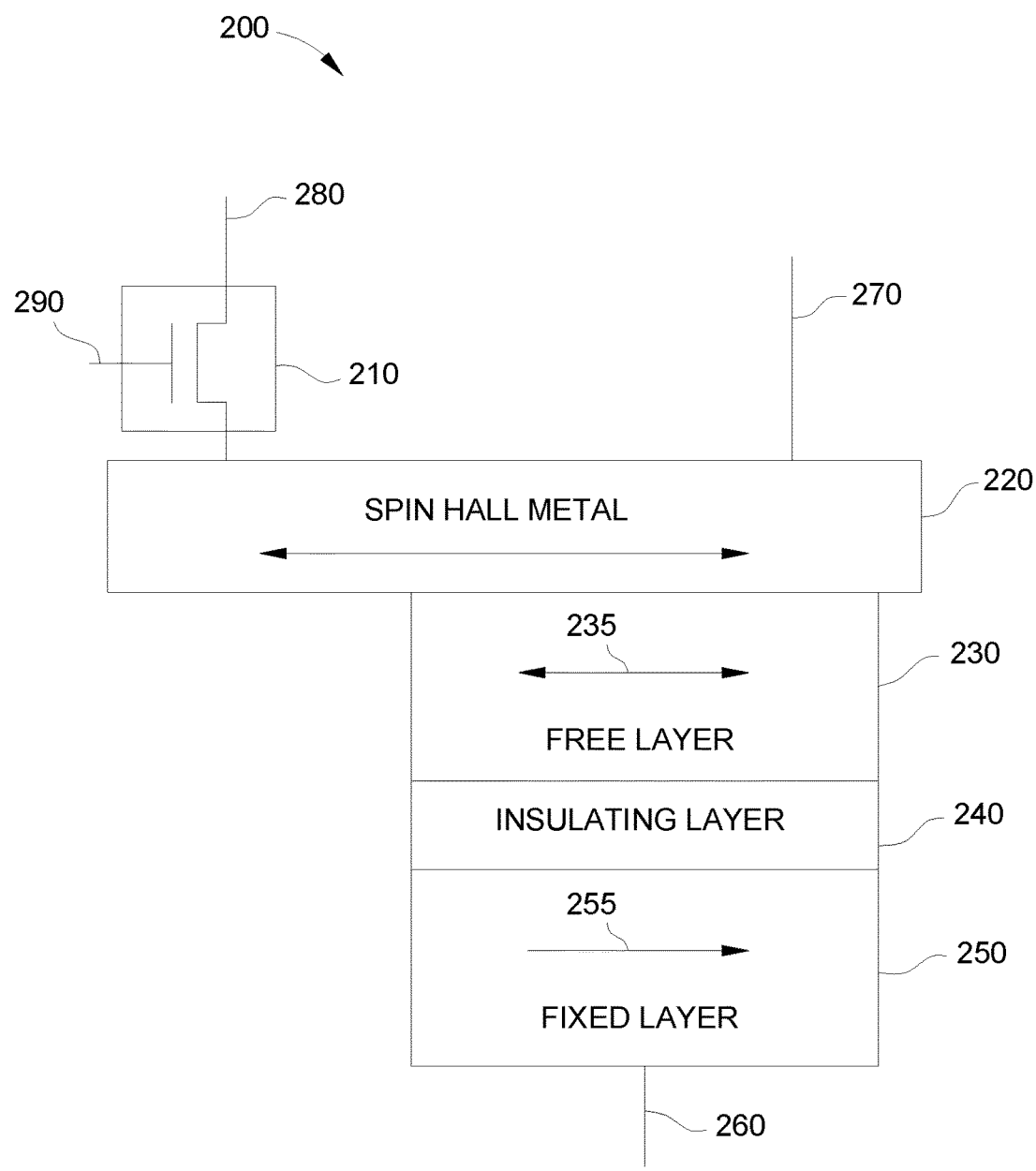
FIG. 2 depicts portions of an SOT-MRAM in accordance with certain aspects of the disclosure.

FIG. 2 shows a 1 transistor 1 resistor (or 1T1R) SOT-MRAM device 200 including an MTJ (the resistor) and a transistor 210. SOT-MRAM 220 includes a conductor 220 (e.g., a spin Hall metal), a free layer 230 with a switchable polarity 235, an insulating layer 240, and a fixed layer 250 with a fixed polarity 255. It will be appreciated that a number of suitable conductors may be used for conductor 220, and a high spin hall angle ($\theta_{SH}$) is preferable (e.g., Platinum, Copper, Lead, Tungsten, Tantalum, other heavy metals, or compounds thereof, etc.). It will be further appreciated that the SOT may be increased or decreased by changing the ratio of conductive material in insulating layer 240 to that in conductor 220.

SOT-MRAM 220 further includes a terminal 260 connected to a voltage line, terminal 270 connected to a write line, terminal 280 connected to a source line, and terminal 290 connected to a word line. Thus it will be appreciated that a voltage applied to terminal 290 can control the operational state of transistor 210. It will be appreciated that other transistor types may be used so long as they are able to control the flow of current through the write path (i.e., between terminal 280 to terminal 270) and the read path (i.e., between terminal 280 to terminal 260). It will be appreciated that the current pathway between terminal 270 and terminal 280 is bidirectional (e.g., current can be directed from terminal 270 to terminal 280 or from terminal 280 to terminal 270) to write to the free layer 230 by changing the direction of polarity 235 (i.e., parallel or anti-parallel to the polarity of fixed later 255). SOT-MRAM 200 is read by measuring the resistance across terminal 260 and terminal 280.

A differential cell, also referred to as a complementary cell, is a memory cell structure that provides benefits such as redundancy to safeguard against bad memory or read errors. Differential cell architecture can also provide amplification of the read signal, thus allowing for more accurate memory, decreased size, and/or decreased write power. Differential cell structures in STT-MRAM are typically less complex than differential cell structures in SOT-MRAM for at least the reason that SOT-MRAM use a spin hall metal connected (or near) the MTJ. Needing the spin hall metal near the MTJ causes design constraints. For example, known differential cell structures in SOT-MRAM use a shared spin hall metal located substantially between two MTJ structures.

Figure 3:
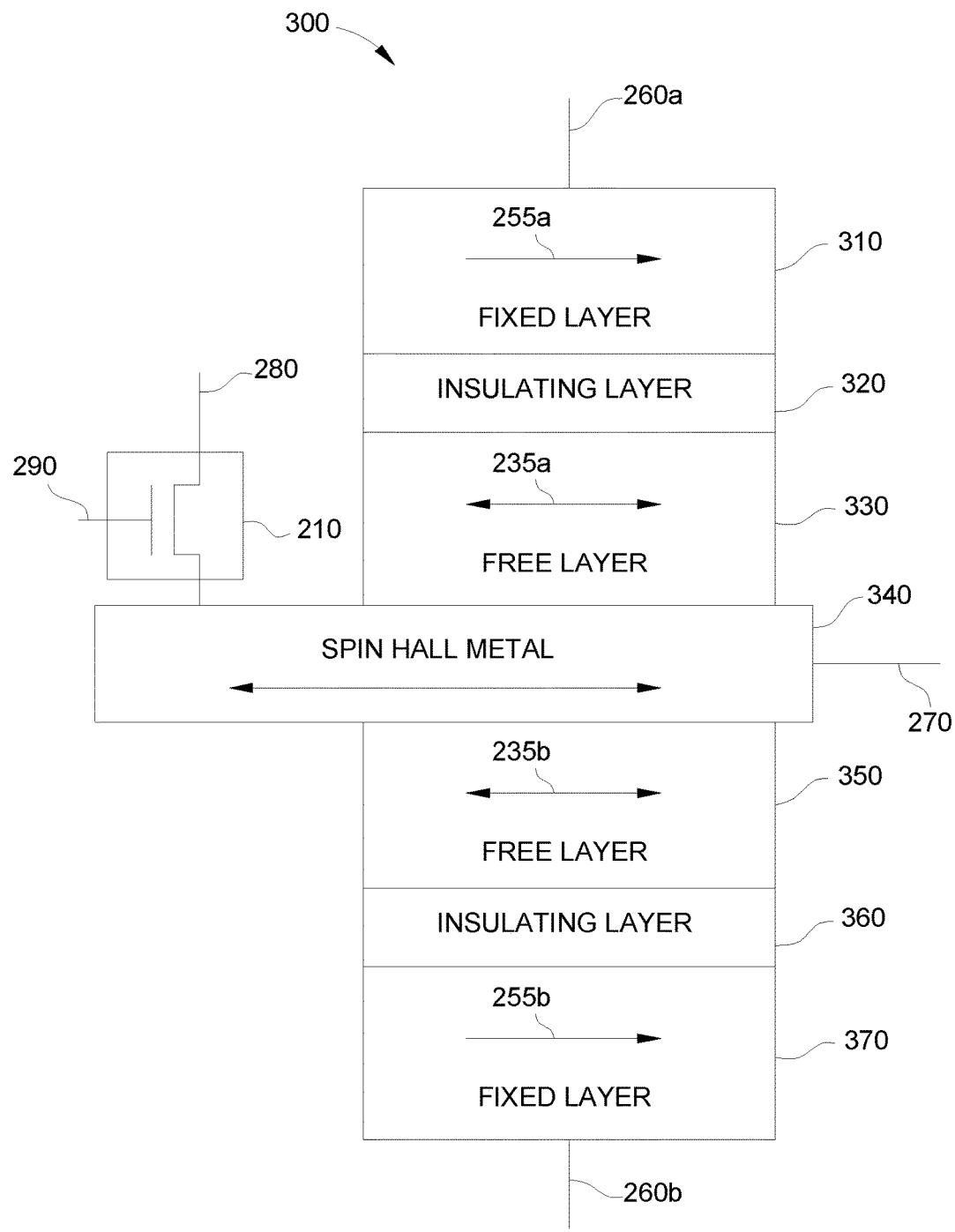
FIG. 3 depicts portions of a differential SOT-MRAM in accordance with certain aspects of the present disclosure.

FIG. 3 shows a differential SOT-MRAM 300 that includes a fixed layer 310, an insulating layer 320, a free layer 330, a spin hall metal 340, a free layer 350, an insulating layer 360, and a fixed layer 370. SOT-MRAM 300 further includes terminals 260a and 260b connected to a voltage line, terminal 270 connected to a write line, terminal 280 connected to a source line, and terminal 290 connected to a word line. A voltage applied to terminal 290 can control the operational state of a transistor 210. It will be appreciated that many transistor types may be used to control the flow of current through the write path (i.e., between terminal 280 and terminal 270) and the read path (i.e., between terminal 280 and terminal 260).

In certain aspects, the current pathway between terminal 270 and terminal 280 is bidirectional (e.g., current can flow from terminal 270 to terminal 280 or from terminal 280 to terminal 270) to concurrently write to free layers 330 and 350 (i.e., changing polarity 235a and polarity 235b). It will be appreciated that the polarity of free layer 235a and 235b will not be the same because spin Hall metal 340 will direct spin-polarized electrons of a first polarity towards free layer 235a and spin-polarized electrons of a second polarity that is opposite the first polarity towards free layer 235b. SOT-MRAM 300 is read by measuring the resistance across terminals 260 and terminal 280. It will be appreciated that SOT-MRAM 300 requires fabrication considerations, such as masking, tooling, and fabrication time for each of the 7 stacked layers (i.e., 310 through 370), which can add time and expense to creating an SOT-MRAM cell or array. Additionally, the packing size, (e.g. length between layer 310 and layer 370) of SOT-MRAM 300 is large.

Figure 4:
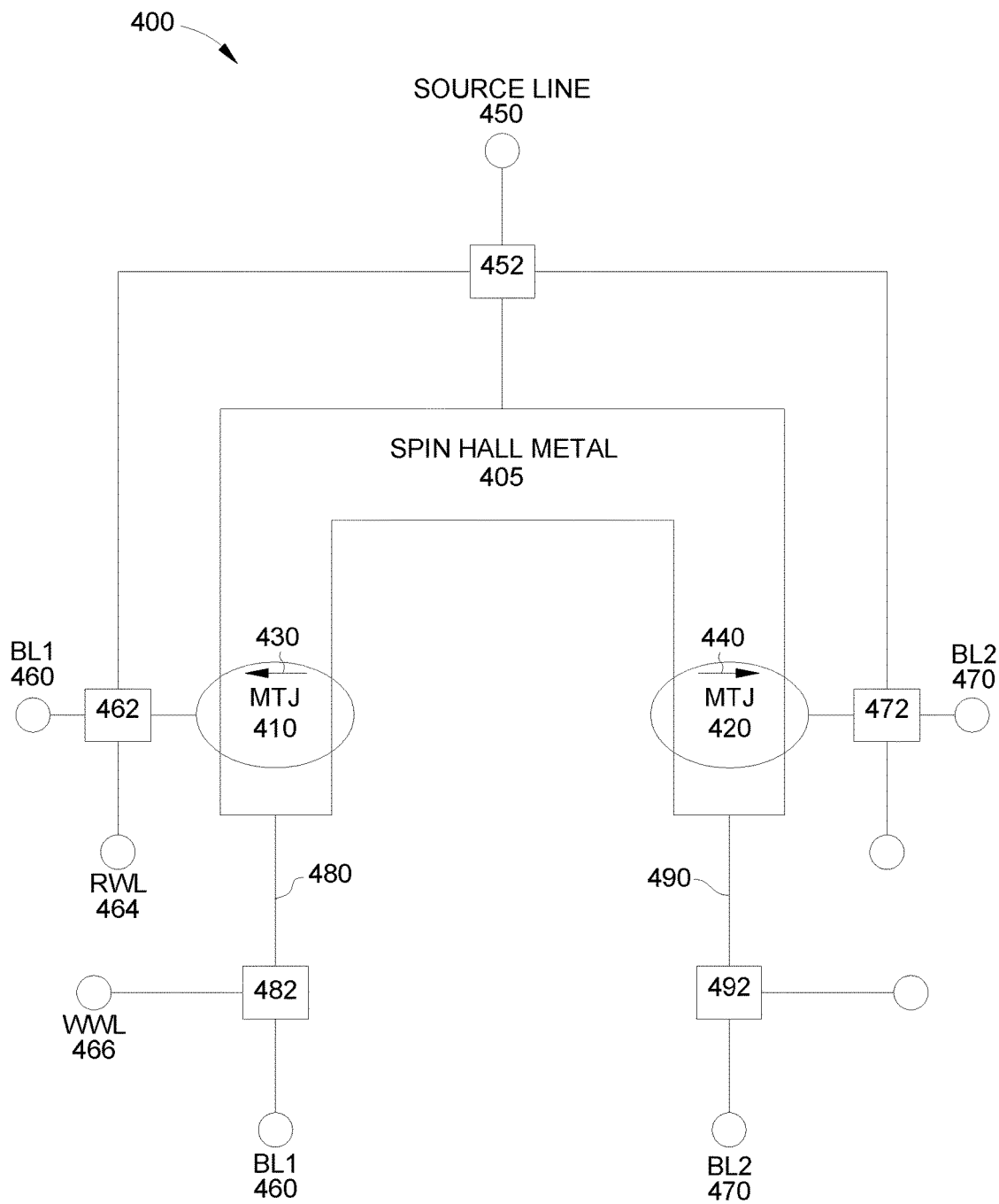
FIG. 4 depicts a differential SOT-MRAM in accordance with certain aspects of the present disclosure.

Shown in FIG. 4, SOT-MRAM 400 is top view of a differential memory cell structure in accordance with certain aspects of the disclosure. SOT-MRAM 400 includes spin hall metal 405, which could be any suitable conductor (e.g., a heavy metal). Spin hall metal 405 is a conductive layer that may be fabricated as one piece of metal or several pieces of metal joined together. In certain aspects, spin hall metal is fabricated in pieces and connected together (e.g., before or after connecting one or more MTJs). In certain aspects, spin hall metal 405 may be fabricated in layers of a single homogeneous metal or several types of metals or other compounds.

For illustrative purposes, spin hall metal 405 may be referred to in certain aspects as having three portions: a first portion, a second portion and a middle portion. As shown in FIG. 4, the first portion of spin hall metal 405 is located about under MTJ 410 and the second portion of spin hall metal 405 is located about under MTJ 420. As shown in FIG. 4, spin hall metal 405 shows the first portion and the second portion configured substantially parallel to each other. Spin hall metal 405 is further configured with a middle portion located between the first portion and the second portion that is substantially orthogonal to the first and second portions. One of skill in the art will appreciate that similar shapes for spin hall metal 405 would be acceptable without deviating from the scope of this disclosure, for example, spin hall metal 405 could be in the shape of the letter U and can be configured with different proportions without deviating from the scope of the disclosure.

FIG. 4 further shows a first MTJ element 410 disposed above the first portion of spin hall metal 405 that includes a first magnetoresistive element having a fixed polarity, a second magnetoresistive element having a free polarity, and an insulating layer between the first magnetoresistive element and the second magnetoresistive element. FIG. 4 further shows a second MTJ 420 disposed above the second portion that includes a first magnetoresistive element having a fixed polarity, a second magnetoresistive element having a free polarity, and an insulating layer between the first magnetoresistive element and the second magnetoresistive element.

In certain aspects, when a current flows in the Y-axis through a substantially straight spin hall metal, the direction of induced spin current (I_spin) is ± in the Z-axis (e.g., into and away from an MTJ above the spin hall metal) based on the direction of the current flow, and the spin current spin polarity is ±X-axis (i.e., orthogonal to the spin hall metal) polarizing the free layer in the same direction as the spin polarity. Therefore, the polarity of the free layer is orthogonal to the spin hall metal. It will be further appreciated that the U-shaped geometry of spin hall metal 405 will generate two spin currents of opposite polarity when a current flows between terminal 480 and terminal 490. In certain aspects, polarity 430 depicts the polarity of the free layer in the first MTJ 410, and polarity 440 depicts the polarity in the free layer in the second MTJ 420. FIG. 4 shows polarity 430 substantially opposite polarity 440 (e.g., when the current flows through spin hall metal 405 from terminal 480 to terminal 490). In other aspects, polarity 430 and polarity 440 will both reverse (i.e., rotate about 180 degrees) when current flows through spin hall metal 405 from terminal 490 to terminal 480. It will be further appreciated that causing current to flow from terminal 480 to terminal 490 and from terminal 490 to terminal 480 is how MTJ 410 and MTJ element 420 are written with complementary bits.

SOT-MRAM 400 is connected to word lines (read word lines (RWL) write word lines (WWL)), bit lines (BL1 and BL2), and a source line. Spin hall metal 405 is connected to a source line 450 (e.g., ground or a reference voltage) through a first transistor 452. Transistor 452 is controlled by a RWL 464.

A first electrode of MTJ 410 (the top electrode) is connected to a voltage line, BL1 460, through transistor 462. Transistor 462 is controlled by RWL 464. A second electrode of MTJ 410 (the bottom electrode) is connected to the same BL1 460 through transistor 482. Transistor 482 is controlled by a WWL 466. It will be appreciated that the bottom electrode of MTJ 410 is also connected to the source line 450 through transistor 452.

A first electrode of MTJ 420 (the top electrode) is connected to a voltage line, BL2 470, through transistor 472. Transistor 472 is controlled by the RWL 464. A second electrode of MTJ 420 (the bottom electrode) is connected to the same BL2 470 through transistor 492. Transistor 492 is controlled by a WWL 466. It will be appreciated that the bottom electrode of MTJ 420 is also connected to the source line 450 through transistor 452.

The SOT-MRAM 400 may also include a controller configured to write values to the MTJs 410 and 420 (not shown). The controller may be a processor, a microcontroller, an application specific integrated circuit (ASIC), a field programmable gate array (FPGA), other programmable logic device (PLD), discrete gate or transistor logic, or a combination thereof.

Figure 5:
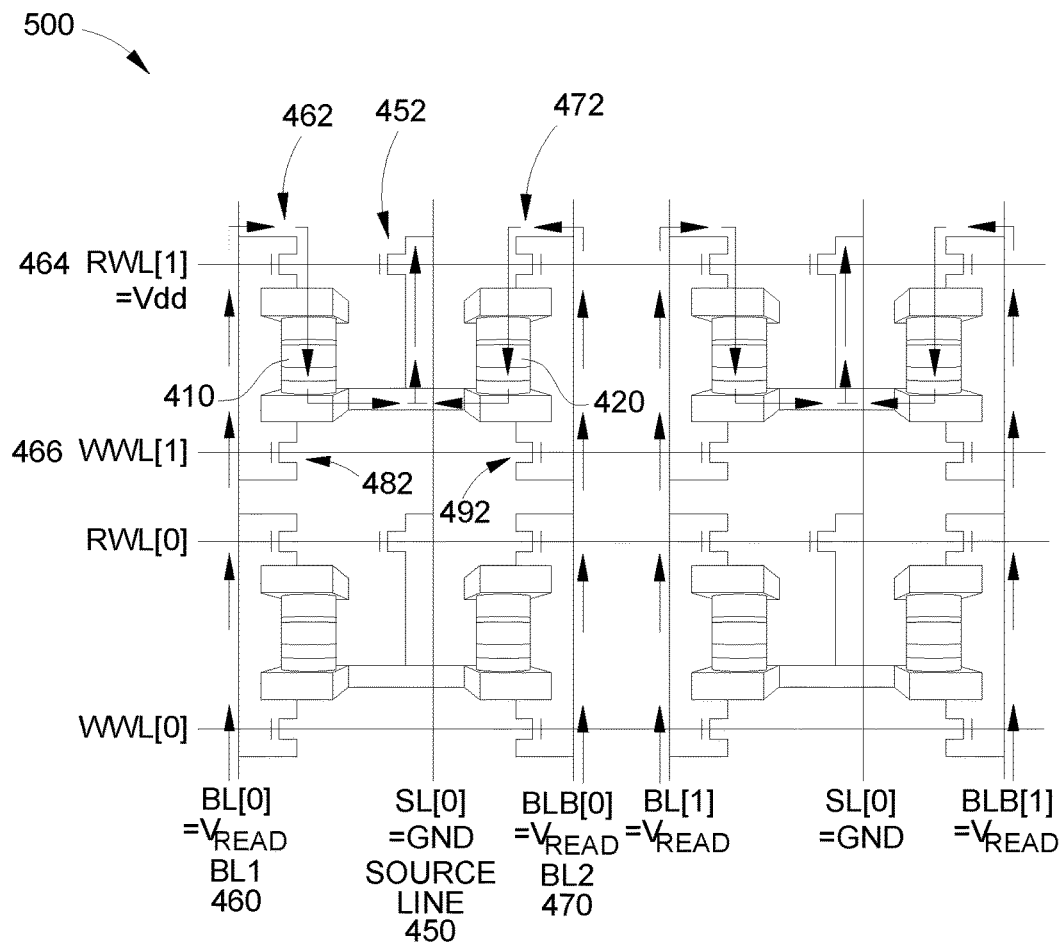
FIG. 5 depicts a read operation for a differential SOT-MRAM in accordance with certain aspects of the present disclosure.

FIG. 5 depicts a 4 cell array using 4 SOT-MRAM 400 memory cells from FIG. 4 during a read operation in accordance with certain aspects of the disclosure. As shown in FIG. 5, during a read operation for the first memory cell in the 4 cell array, RWL 464 is energized opening a current path from BL1 460 to source line 450 by energizing transistors 462 and 452, and from BL2 470 to source line 450 by energizing transistor 472 and 452. In certain aspects, the resistance between the BL1 460 and source line 450, and BL2 470 and source line 450, are used in part to determine a memory state (e.g., a 1 or a 0) for the first memory cell in FIG. 5.

Figure 6:
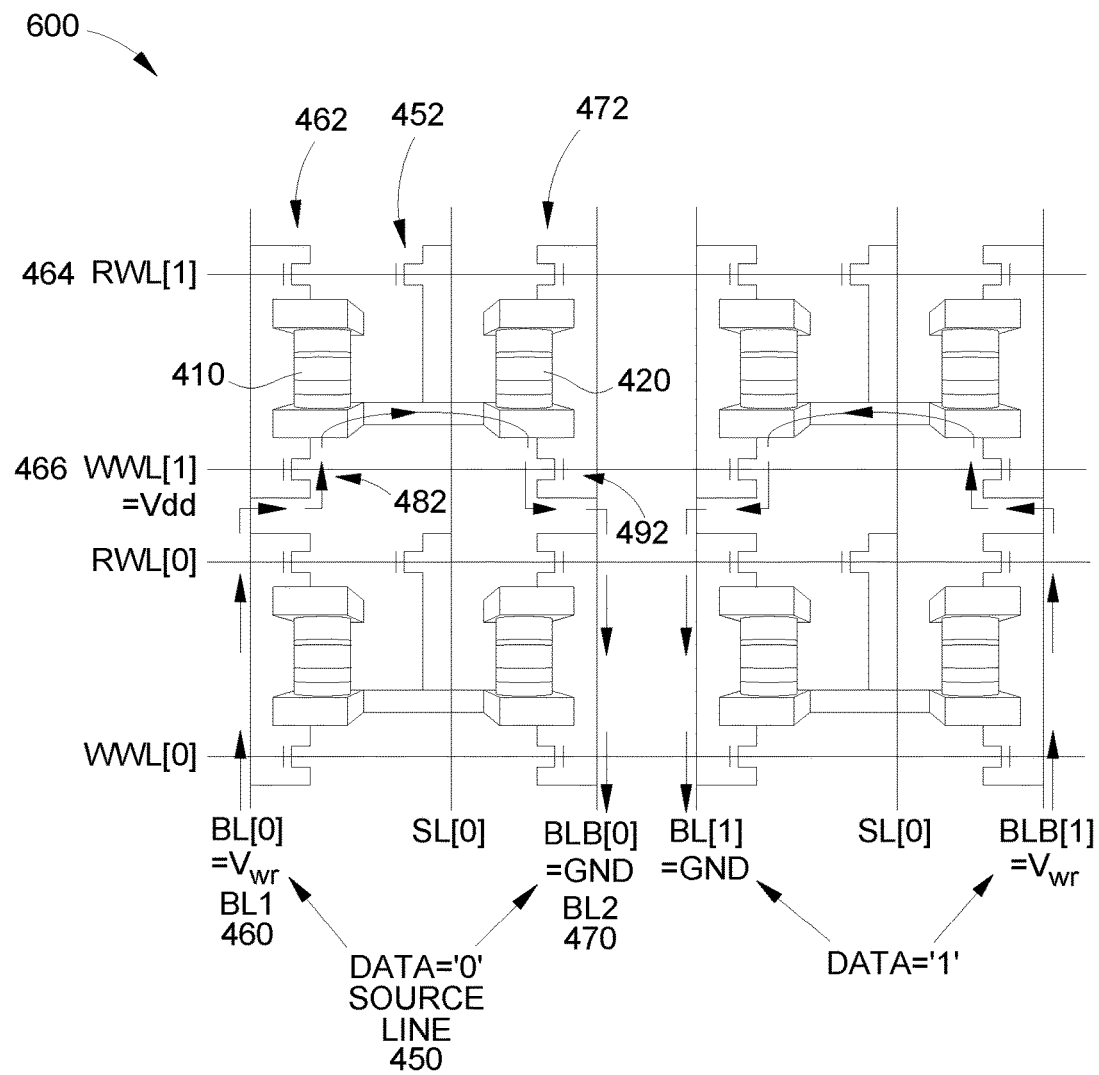
FIG. 6 depicts a write operation SOT-MRAM in accordance with certain aspects of the present disclosure.

FIG. 6 depicts a 4 cell array using 4 SOT-MRAM 400 memory cells from FIG. 4 during a write operation in accordance with certain aspects of the disclosure. As shown in FIG. 6, during a write operation for cell 600a, WWL 466 is energized opening a current path from BL1 460 to BL2 470 by energizing transistor 482 and 492. It will be appreciated that when current flows from BL1 460 to BL2 470 (e.g., when a first voltage is applied to BL1 460 and a lower (e.g., ground) voltage is applied to BL2 470), MTJ 410 is in the anti-parallel state, and MTJ 420 is in the parallel state, which in certain aspects may represent a bit in a first state (e.g., a 0). In other aspects, current may flow from BL2 470 to BL1 460 (e.g., when a first voltage is applied to BL2 470 and a lower (e.g., ground) voltage is applied to BL1 460), MTJ 410 is in the parallel state, and MTJ 420 is in the anti-parallel state, which in certain aspects may represent a bit in a second state (e.g., a 1). It will be appreciated that MTJ 410 and MTJ 420 in FIGS. 4-6 may use in-plane MTJ technology or perpendicular MTJ technology without deviating from the scope of the disclosure. It will be further appreciated that larger and smaller arrays are contemplated by the disclosure.

Figure 7:
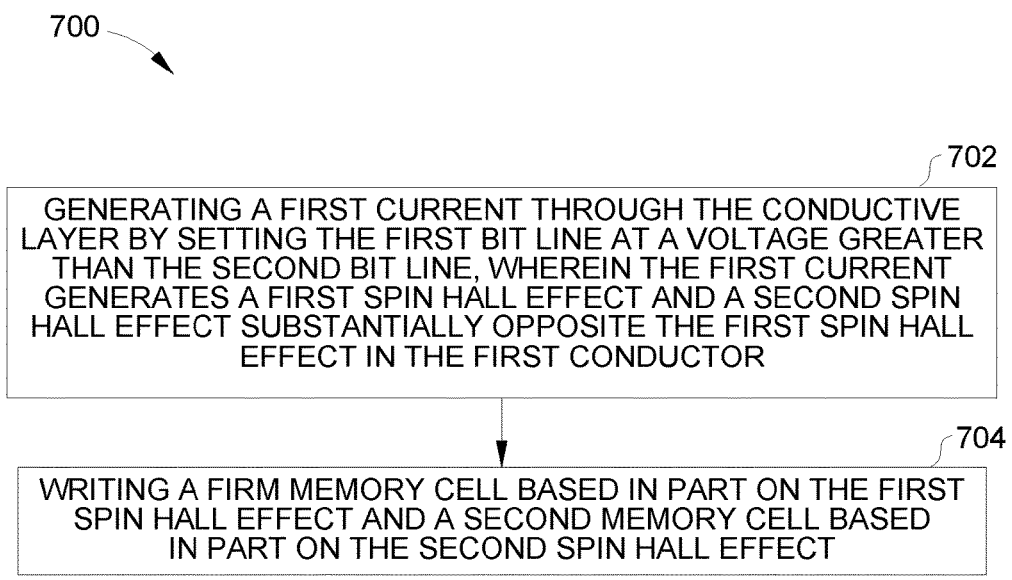
FIG. 7 is a flow diagram of example operations for writing a differential SOT-MRAM, in accordance with certain aspects of the present disclosure.

FIG. 7 is a flow diagram of example operations for writing to MRAM (e.g., SOT-MRAM 400 in FIG. 4), in accordance with certain aspects of the present disclosure. The operations 700 may be performed, for example, by a controller coupled to one or more differential SOT-MRAM cells to conduct the writing operation.

The operations 700 begin, at 702, where the controller generates a first current through the conductive layer by setting the first bit line at a voltage greater than the second bit line, wherein the first current generates a first spin hall effect and a second spin hall effect substantially opposite the first spin hall effect in the first conductor. It will be appreciated that the first spin hall effect and the second spin hall effect are substantially opposite based at least in part on the geometry of the conductive layer. For example, in certain aspects, having a spin hall metal, with angles (e.g., two 90 degree angles) that total 180 degrees will generate a first spin hall effect and a second spin hall effect substantially opposite the first spin hall effect based at least in part on the geometry when current travels from one end to the other. Thus, in certain aspects, spin-polarized electrons of a first spin polarization enter the first MTJ (e.g., MTJ 410) and spin-polarized electrons of a second spin polarization that is substantially opposite the first spin polarization enter the second MTJ (e.g., MTJ 420), wherein the spin-polarized electrons of a first spin write the first MTJ and the spin-polarized electrons of the second spin write the second MTJ.

At 704, the first memory cell is written based in part on the first spin hall effect and a second memory cell is written based in part on the second spin hall effect. It will be appreciated that the polarity of the free layer in the first memory cell and the free layer in the second memory cell are written with substantially opposite polarity.

Figure 8:
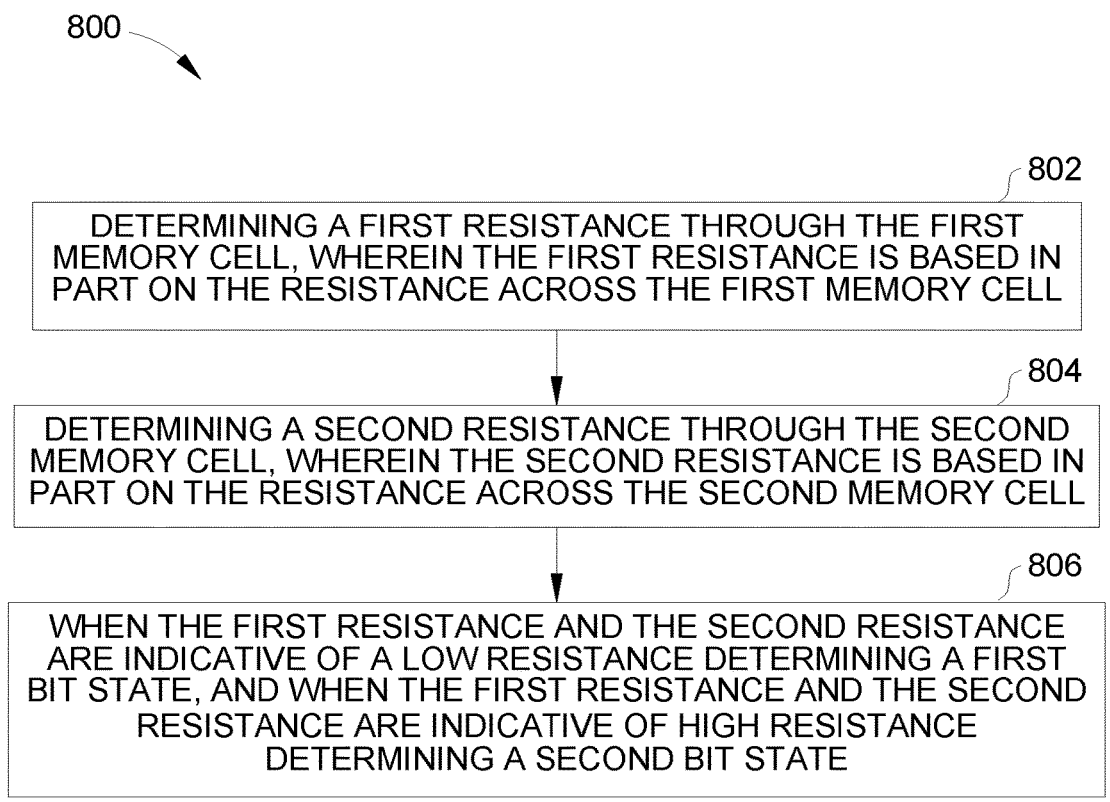
FIG. 8 is a flow diagram of example operations for reading a differential SOT-MRAM, in accordance with certain aspects of the present disclosure.

FIG. 8 is a flow diagram of example operations for reading MRAM (e.g., SOT-MRAM 400 in FIG. 4), in accordance with certain aspects of the present disclosure. The operations 800 may be performed, for example, by a controller coupled to one or more differential SOT-MRAM cells to conduct the reading operation.

The operations 800 begin, at 802, where the controller determines a first resistance through the first memory cell, wherein the first resistance is based in part on the resistance across the first memory cell.

At 804, the controller determines a second resistance through the second memory cell, wherein the second resistance is based in part on the resistance across the second memory cell.

At 806, the controller determines a first bit state when the first resistance and the second resistance are indicative of a first bit state. For example, a first bit state may be indicated when the first resistance is a high resistance and the second resistance is a low resistance. In other aspects, a first bit state may be indicated when the first resistance is a low resistance and the second resistance is a high resistance. At 806, the controller determines a second bit state when the first resistance and the second resistance are indicative of a second bit state. For example, a second bit state may be indicated when the first resistance is a high resistance and the second resistance is a low resistance. In other aspects, a second bit state may be indicated when the first resistance is a low resistance and the second resistance is a high resistance.

Figure 9:
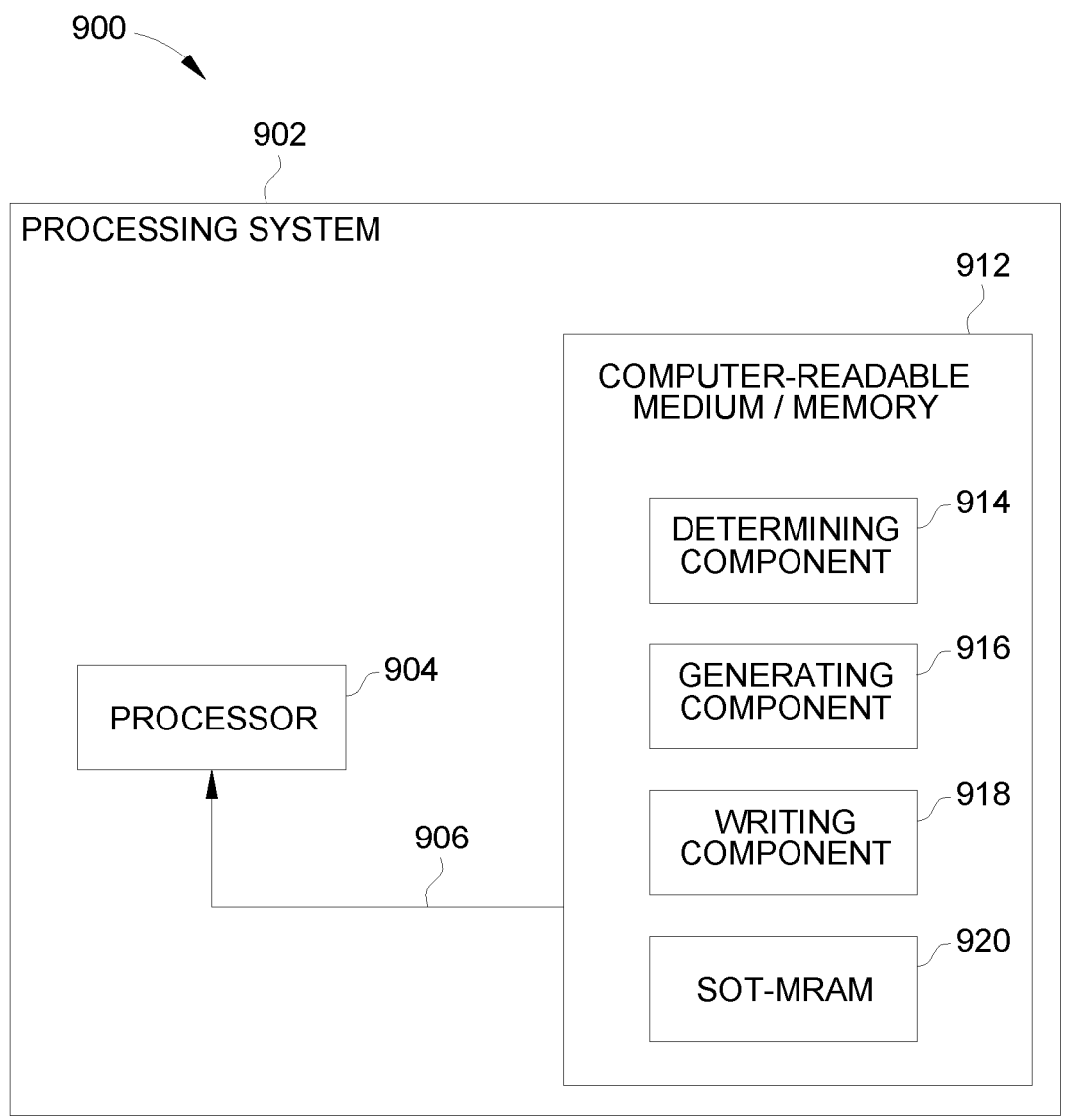
FIG. 9 illustrates an example system-on-chip (SOC) that may include various components configured to perform the reading and writing operations disclosed herein, in accordance with certain aspects of the present disclosure.

In certain aspects, the differential SOT-MRAM may be packaged on a stand alone memory chip or an integrated circuit having a processing system. For example, FIG. 9 illustrates an example system-on-chip (SoC) 900 that may include various components configured to perform the reading and writing operations disclosed herein, such as the operations illustrated in FIGS. 7 and 8. The SoC 900 includes a chip package 902 having a processor 904 coupled to a computer-readable medium/memory 912 via a bus 906. In certain aspects, the computer-readable medium/memory 912 may include SOT-MRAM 920.

The differential SOT-MRAM provides various improvements over conventional differential SOT-MRAM. It will be appreciated that in certain aspects, the differential SOT-MRAM described herein may allow for a reduction in the number of layers (or masks) needed for fabrication as both MTJs can be fabricated substantially at the same time. It will be further appreciated that the differential SOT-MRAM described herein may allow for a reduced stack height compared to known differential SOT-MRAM cell structures and arrays.

The preceding description is provided to enable any person skilled in the art to practice the various embodiments described herein. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

A processing system may be implemented with a bus architecture. The bus may include any number of interconnecting buses and bridges depending on the specific application of the processing system and the overall design constraints. The bus may link together various circuits including a processor, machine-readable media, and input/output devices, among others. A user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media, such as any medium that facilitates transfer of a computer program from one place to another. The processor may be responsible for managing the bus and general processing, including the execution of software modules stored on the computer-readable storage media. A computer-readable storage medium may be coupled to a processor such that the processor can read information from, and write information to, the storage medium. In the alternative, the storage medium may be integral to the processor. By way of example, the computer-readable media may include a transmission line, a carrier wave modulated by data, and/or a computer readable storage medium with instructions stored thereon separate from the wireless node, all of which may be accessed by the processor through the bus interface. Alternatively, or in addition, the computer-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module, it will be understood that such functionality is implemented by the processor when executing instructions from that software module.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A differential magnetoresistive random access memory (MRAM) comprising:
    a first magnetic tunnel junction (MTJ) storage element comprising a first fixed layer, a first insulating layer, and a first free layer, and a second MTJ storage element comprising a second fixed layer, a second insulating layer, and a second free layer; and
    a conductive layer connected to a source line, first bit line, and a second bit line, wherein the first MTJ storage element is disposed above and connected to the conductive layer and the first bit line at a first end and connected to the first bit line at a second end, and wherein the second MTJ storage element is disposed above and connected to the conductive layer and the second bit line at a first end and connected to the second bit line at a second end.

2. The differential MRAM of claim 1, wherein the first MTJ storage element the second MTJ storage element each comprise an in-plane MTJ storage element.

3. The differential MRAM of claim 1, wherein the first MTJ storage element the second MTJ storage element each comprise a perpendicular MTJ storage element.

4. The differential MRAM of claim 1, wherein the conductive layer connected to a source line, first bit line, and a second bit line further comprises:
    a first transistor disposed between the source line and the conductive layer, wherein the first transistor is connected to a first read line;
    a second transistor disposed between the first bit line and the first end of the first MTJ storage element;
    a third transistor disposed between the second bit line and the first end of the second MTJ storage element;
    a fourth transistor disposed between the first bit line and the second end of the first MTJ storage element; and
    a fifth transistor disposed between the second bit line and the first end of the second MTJ storage element.

5. The differential MRAM of claim 1, wherein the first free layer and the second free layer are of opposite polarity.

6. The differential MRAM of claim 1, wherein the first MTJ storage element and the second MTJ storage element are formed at substantially the same time.

7. The differential MRAM of claim 1, wherein the conductive layer is a spin hall metal.

8. The differential MRAM of claim 1, wherein the conductive layer is substantially U-shaped.

* * * * *